US012770670B2

(12) United States Patent
Pan et al.

(10) Patent No.: US 12,770,670 B2
(45) Date of Patent: Oct. 20, 2026

(54) OPERATION METHOD OF FERROELECTRIC MEMORY

(71) Applicant: Wuxi Smart Memories Technologies Co., Ltd., Wuxi (CN)

(72) Inventors: Feng Pan, Wuxi (CN); Ke Ma, Wuxi (CN); Tong Feng, Wuxi (CN)

(73) Assignee: WUXI SMART MEMORIES TECHNOLOGIES CO., LTD., Wuxi (CN)

( * ) Notice: Subject to any disclaimer, the term of this patent is extended or adjusted under 35 U.S.C. 154(b) by 129 days.

(21) Appl. No.: 18/911,354

(22) Filed: Oct. 10, 2024

(65) Prior Publication Data

US 2026/0105945 A1 Apr. 16, 2026

(51) Int. Cl.
*G11C 11/22* (2006.01)
*H10B 53/30* (2023.01)

(52) U.S. Cl.
CPC ........ *G11C 11/2275* (2013.01); *G11C 11/221* (2013.01); *G11C 11/2273* (2013.01); *H10B 53/30* (2023.02)

(58) Field of Classification Search
CPC .............. G11C 11/2275; G11C 11/221; G11C 11/2273; H10B 53/30
See application file for complete search history.

(56) References Cited

U.S. PATENT DOCUMENTS 5,251,321 A * 10/1993 Boothroyd .......... G06F 9/30025 708/204
5,978,252 A 11/1999 Miwa
2004/0062070 A1 * 4/2004 Coulson ............. G11C 13/0014 365/145

* cited by examiner

*Primary Examiner* — Mohammed A Bashar
(74) *Attorney, Agent, or Firm* — Bayes PLLC

(57) ABSTRACT

According to one aspect, a method of operating a set of ferroelectric memory cells is provided. The method may include writing a first data bit having a first value to a first ferroelectric memory cell. The method may include writing a sign bit having the first value to second ferroelectric memory cell. The method may include receiving a read or a write-operation request. The method may include reading the sign bit from the second ferroelectric memory cell. The method may include, in response to the sign bit having a second value, inverting the first data bit from the second value to the first value. The method may include, in response to the sign bit having a second value, reading the first data bit with the first value from the first ferroelectric memory cell after the inverting.

20 Claims, 5 Drawing Sheets

300

400

OPERATION METHOD OF FERROELECTRIC MEMORY

BACKGROUND

Embodiments of the present disclosure relate to ferroelectric memory and operation methods thereof.

Ferroelectric memory, such as ferroelectric RAM (FeRAM or FRAM), uses a ferroelectric material layer to achieve non-volatility. A ferroelectric material has a nonlinear relationship between the applied electric field and the apparent stored charge and thus, can switch polarity in an electric field. Ferroelectric memory's advantages include low power consumption, fast write performance, and a desirable level of maximum read/write endurance.

SUMMARY

According to one aspect of the present disclosure, a method of operating a set of ferroelectric memory cells is provided. The method may include writing a first data bit having a first value to a first ferroelectric memory cell of the set of ferroelectric memory cells. The method may include writing a sign bit having the first value to second ferroelectric memory cell of the set of ferroelectric memory cells. The sign bit may indicate a polarity of the first ferroelectric memory cell and the second ferroelectric memory cell. The method may include receiving a read-operation request or a write-operation request for the first ferroelectric memory cell. The method may include in response to the read-operation request or the write-operation request, reading the sign bit from the second ferroelectric memory cell. The method may include in response to the sign bit having a second value, inverting the first data bit from the second value to the first value. The method may include in response to the sign bit having a second value, reading the first data bit with the first value from the first ferroelectric memory cell after the inverting.

In some implementations, the method may include in response to the sign bit having the first value, reading the first data bit from the first ferroelectric memory cell.

In some implementations, the method may include, in response to the write-operation request, inverting the sign bit from the first value to the second value.

In some implementations, the method may include, in response to the write-operation request, writing a second data bit having a second value to the first ferroelectric memory cell and the sign bit having the second value to the second ferroelectric memory cell.

In some implementations, the second data bit having the second value may be new data.

In some implementations, the method may include, in response to the read-operation request, inverting the first data bit from the first value to the second value.

In some implementations, the method may include, in response to the read-operation request, writing the first data bit having a second value to the first ferroelectric memory cell and the sign bit having the second value to the second ferroelectric memory cell.

In some implementations, the method may include the first data bit having the second value and the sign bit having the second value are written to the first ferroelectric memory cell and the second ferroelectric memory cell, respectively, as part of a write-back operation.

In some implementations, the first data bit having the second value may be written to the first ferroelectric memory cell concurrent with the sign bit having the second value being written to the second ferroelectric memory cell.

In some implementations when the sign bit has the first value, the first data bit may have a correct polarity. In some implementations when the sign bit has the second value, the first data bit may have an inverted polarity from actual data.

According to another aspect of the present disclosure, a memory device is provided. The memory device may include a set of ferroelectric memory cells and a peripheral circuit coupled to the set of ferroelectric memory cells. The peripheral circuit may be configured to write a first data bit having a first value to a first ferroelectric memory cell of the set of ferroelectric memory cells. The peripheral circuit may be configured to write a sign bit having the first value to second ferroelectric memory cell of the set of ferroelectric memory cells. The sign bit may indicate a polarity of the first ferroelectric memory cell and the second ferroelectric memory cell. The peripheral circuit may be configured to receive a read-operation request or a write-operation request for the first ferroelectric memory cell. The peripheral circuit may be configured to in response to the read-operation request or the write-operation request, read the sign bit from the second ferroelectric memory cell. The peripheral circuit may be configured to in response to the sign bit having a second value, invert the first data bit from the second value to the first value. The peripheral circuit may be configured to in response to the sign bit having a second value, read the first data bit with the first value from the first ferroelectric memory cell after inverting.

In some implementations, the peripheral circuit may be further configured to, in response to the sign bit having the first value, read the first data bit from the first ferroelectric memory cell.

In some implementations, the peripheral circuit may be further configured to, in response to the write-operation request, invert the sign bit from the first value to the second value.

In some implementations, the peripheral circuit may be further configured to, in response to the write-operation request, write a second data bit having a second value to the first ferroelectric memory cell and the sign bit having the second value to the second ferroelectric memory cell.

In some implementations, the second data bit having the second value may be new data.

In some implementations, the peripheral circuit may be further configured to, in response to the read-operation request, invert the first data bit from the first value to the second value.

In some implementations, the peripheral circuit may be further configured to, in response to the read-operation request, write the first data bit having a second value to the first ferroelectric memory cell and the sign bit having the second value to the second ferroelectric memory cell.

In some implementations the first data bit having the second value and the sign bit having the second value may be written to the first ferroelectric memory cell and the second ferroelectric memory cell, respectively, as part of a write-back operation.

In some implementations, the first data bit having the second value may be written to the first ferroelectric memory cell concurrent with the sign bit having the second value being written to the second ferroelectric memory cell.

In some implementations when the sign bit has the first value, the first data bit may have a correct polarity. In some implementations when the sign bit has the second value, the first data bit may have an inverted polarity from actual data.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
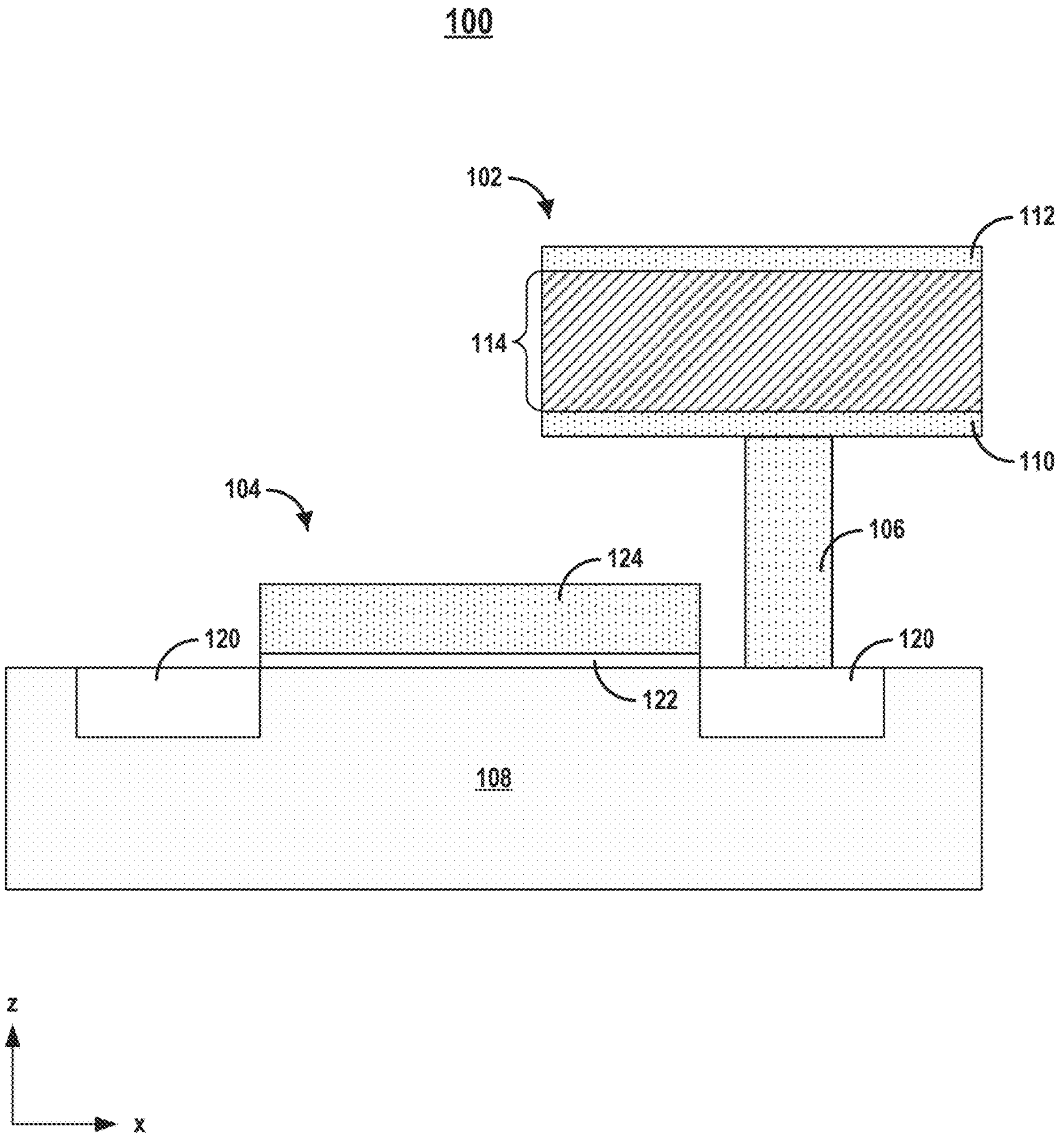
FIG. 1 illustrates a cross-section of a ferroelectric memory cell, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "three-dimensional (3D) memory device" refers to a semiconductor device with vertically oriented strings of memory cell transistors (referred to herein as "memory strings") on a laterally-oriented substrate so that the memory strings extend in the vertical direction with respect to the substrate. As used herein, the term "vertical/vertically" means nominally perpendicular to the lateral surface of a substrate.

FeRAM is a random-access memory similar to DRAM. However, instead of a dielectric layer, it uses a ferroelectric layer to achieve non-volatility. FeRAM is one of a growing number of alternative non-volatile random-access memory technologies that offer the same functionality as flash memory. A FeRAM chip contains a thin film of ferroelectric material. The ions in the ferroelectric layer change their relative positions in the presence of an electric field, thereby producing a power-efficient binary switch. The positive ions can maintain the position after the removal of the external electrical field. The subtle difference in ion position change can be detected with an external circuit. A beneficial characteristic of the ferroelectric layer is that it is not affected by power disruption or magnetic interference. This makes FeRAM a reliable non-volatile memory.

The dielectric constant of a ferroelectric material is typically much higher than that of a linear dielectric material due to the effects of semi-permanent electric dipoles formed in its crystal structure. When an external electric field is applied across a ferroelectric material, the dipoles tend to align themselves with the field direction, produced by small shifts in the positions of positive ions and shifts in the distributions of electronic charge in the crystal structure. After the charge is removed, the dipoles retain their polarization state. Binary "0" and "1" are stored as one of two possible electric polarizations in each data storage cell (also referred to herein as a "FeRAM cell"). For example, a "1" is encoded using the negative remnant polarization "−Pr," and a "0" is encoded using the positive remnant polarization "+Pr."

Writing to a FeRAM cell is accomplished by charging plates on either side of the ferroelectric layer. This applies a field across the ferroelectric layer, which forces the positive ions into the "up" or "down" orientation (depending on the polarity of the charge), thereby storing a data bit of "1" or "0". During a read operation, the transistor forces a FeRAM cell into a particular state, say "0". If the FeRAM cell holds a "0", nothing will change in the FeRAM cell. If the FeRAM cell holds a "1", the re-orientation of the positive ions in the film will cause the effective extra charge to be dumped to the signal line of "0" cell. The presence of this extra charge indicates the FeRAM cell holds a "1". Since this process overwrites the cell, reading a FeRAM cell is a destructive process, and requires the data bit to be re-written to the FeRAM cell after it has been read.

The polarization density of a FeRAM cell is characterized by a 2Pr window. The 2Pr window is the charge differentiation between the bit value of 0 and the bit value of 1 per-unit-area. So, the larger the size of the FeRAM cap, the larger the signal. The 2Pr window is associated with the signal-to-noise ratio. The FeRAM controller performs the sensing operation based on the signal-to-noise ratio associated with the 2Pr window. A FeRAM memory device may include a controller that performs a sensing operation to identify the content of cells. Because the output lines carry noise, the signal must be larger than the noise to allow the sensing of the FeRAM cell by the controller.

FeRAM suffers from various noise sources during operation over the course of its lifetime. Consequently, the signal from the cell will be reduced and/or the noise will be increased. This makes it difficult to write cell and ensure it to be sensed properly afterward due to the reduced signal-to-noise ratio.

To overcome these and other challenges, the present disclosure provides an exemplary sign-bit implementation scheme to mitigate the negative effects of these noise sources. The sign-bit implementation scheme may include writing a set of sign bits (e.g., one or more sign bit(s)) to the FeRAM cell along with a data bit. The set of sign bits may indicate the polarity of the data bit written to the FeRAM cell. Because the set of sign bits may also experience a change of polarity due to manufacturing defects or the noise sources, the sign-bit implementation scheme of the present disclosure tracks the polarity of a stored cell state after any write operation. In some implementations, the sign-bit implementation scheme may alternatingly invert the polarity of the sign bit and the data bit in different write operations to mitigate imprint. Additional details of the exemplary sign-bit implementation scheme are set forth below in connection with FIGS. 1-4.

FIG. 1 illustrates a cross-section of an exemplary ferroelectric memory cell 100, according to some embodiments of the present disclosure. Ferroelectric memory cell 100 is the basic storage element of a ferroelectric memory device and can include various designs and configurations. As shown in FIG. 1, ferroelectric memory cell 100 is a "1T-1C" cell that includes a capacitor 102, a transistor 104, and an interconnect 106 between capacitor 102 and transistor 104 formed on a substrate 108. Substrate 108 can include silicon (e.g., single crystalline silicon), silicon germanium (SiGe), gallium arsenide (GaAs), germanium (Ge), silicon on insulator (SOI) or any other suitable materials.

In some embodiments, capacitor 102 includes a lower electrode 110, an upper electrode 112, and a ferroelectric layer 114 disposed vertically between lower electrode 110 and upper electrode 112. Ferroelectric layer 114 can be in contact with and electrically connected to lower electrode 110 on a lower surface, and in contact with and electrically connected to upper electrode 112 on an upper surface. Lower electrode 110 can be electrically connected to transistor 104 through interconnect 106, and upper electrode 112 can be electrically connected to a voltage source (not shown), such that an electrical field can be applied to ferroelectric layer 114. For ease of description, the example of a 1T-1C cell is illustrated in the present disclosure. In various embodiments, ferroelectric layer 114 can be used in any other suitable types of memory cells with more than one capacitor per cell. For example, ferroelectric layer 114 can also be used in a "2T-2C" cell or a "nT-mC" cell (where n and m are integers). The type of memory cells (e.g., the number of capacitors in a single memory cell) should not be limited by the embodiments of the present disclosure.

The materials of lower electrode 110 and upper electrode 112 can include, but not limited to, at least one of titanium nitride (TiN), titanium silicon nitride (TiSiNx), titanium aluminum nitride (TiAlNx), titanium carbon nitride (TiCNx), tantalum nitride (TaNx), tantalum silicon nitride (TaSiNx), tantalum aluminum nitride (TaAlNx), tungsten nitride (WNx), tungsten silicide (WSix), tungsten carbon nitride (WCNx), ruthenium (Ru), ruthenium oxide (RuOx), iridium (Ir), doped polysilicon, transparent conductive oxides (TCO), or iridium oxide (IrOx). In some embodiments, lower electrode 110 and upper electrode 112 include the same material(s). In some embodiments, lower electrode 110 and upper electrode 112 include different materials. The thickness of lower electrode 110 or upper electrode 112 can be between about 2 nm and about 50 nm, such as between 2 nm and 20 nm (e.g., 2 nm, 3 nm, 4 nm, 5 nm, 8 nm, 10 nm, 15 nm, 18 nm, 20 nm, 25 nm, 30 nm, 35 nm, 40 nm, 45 nm, 50 nm, any range bounded on the lower end by any of these values, or in any range defined by any two of these values). In some embodiments, lower electrode 110 and upper electrode 112 have the same thickness. In some embodiments, lower electrode 110 and upper electrode 112 have different thicknesses.

In some embodiments, ferroelectric layer 114 includes a ferroelectric oxide material. The ferroelectric oxide material can include a ferroelectric composite oxide. In one example, the ferroelectric oxide material may include oxygen and one or more ferroelectric metals. The ferroelectric metals can include, but not limited to, zirconium (Zr), hafnium (Hf), and titanium (Ti). In some embodiments, the ferroelectric metals also include aluminum (Al), nickel (Ni), and/or iron (Fe). In some embodiments, the ferroelectric oxide material includes $HfO_x$. In some embodiments, the ferroelectric oxide material includes oxygen and two or more ferroelectric metals. The molar ratio between two of the ferroelectric metals can be between 0.1 and 10 (e.g., 0.1, 0.2, 0.3, 0.4, 0.5, 0.6, 0.7, 0.8, 0.9, 1, 2, 3, 4, 5, 6, 7, 8, 9, 10, any range bounded on the lower end by any of these values, or in any range defined by any two of these values). In some embodiments, the ferroelectric oxide material includes oxygen and a non-metal material, such as silicon.

In some embodiments, transistor 104 includes source/drain regions 120 and a gate stack having a gate dielectric 122 and a gate conductor 124. Source/drain regions 120 can be doped regions in substrate 108 with n-type or p-type dopants at a desired doping level. Gate dielectric 122 can include dielectric materials, such as silicon oxide ($SiO_x$), silicon nitride ($SiN_x$) or high-k dielectric materials including, but not limited to, aluminum oxide ($Al_2O_3$), hafnium oxide ($HfO_2$), tantalum oxide ($Ta_2O_5$), zirconium oxide ($ZrO_2$), titanium oxide ($TiO_2$), or any combination thereof. Gate conductor 124 can include conductive materials including, but not limited to, tungsten (W), cobalt (Co), copper (Cu), aluminum (Al), polysilicon, silicides, or any combination thereof. Gate conductor 124 can function as the word line of ferroelectric memory cell 100. An interconnect (not shown) can be in contact with one of source/drain regions 120 that is not in contact with interconnect 106 and functions as the bit line of ferroelectric memory cell 100. It is understood that the ferroelectric memory cells disclosed herein are not limited to the example shown in FIG. 1 and may include any planar ferroelectric memory cells or 3D ferroelectric memory cells in any suitable configurations.

Figure 2A:
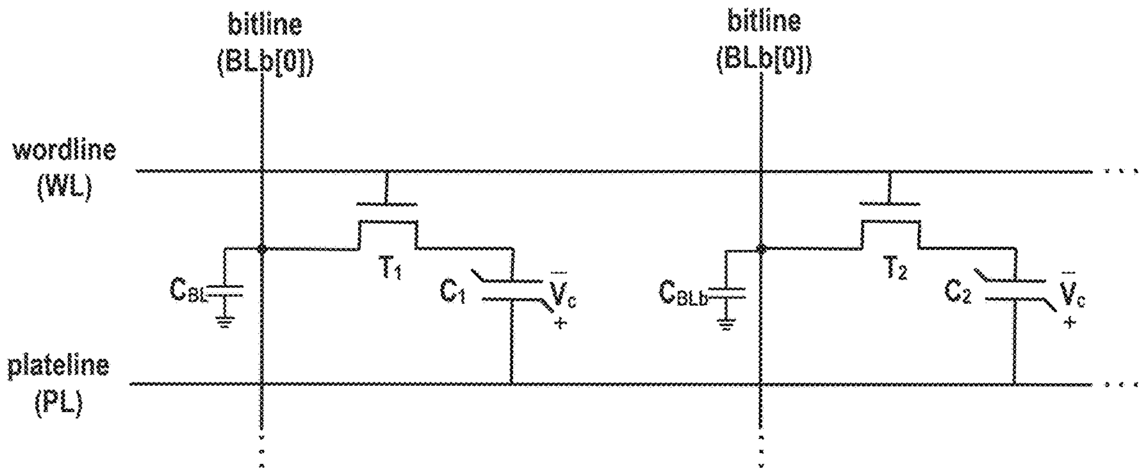
FIG. 2A illustrates a circuit diagram of a ferroelectric memory cell, according to some embodiments of the present disclosure.

FIG. 2A illustrates a circuit diagram of an exemplary ferroelectric memory cell, according to some embodiments of the present disclosure. The ferroelectric memory cell may be a 1T-1C ferroelectric memory cell, such as ferroelectric memory cell 100 in FIG. 1. The gate of the transistor T is electrically connected to a word line (WL), one of the source and drain of the transistor T is electrically connected to a bit line (BL), and the other one of the source and drain of the transistor T is electrically connected to one electrode of the capacitor C. The other electrode of capacitor C is electrically connected to a plate line (PL), which can apply a voltage $V_C$ on the capacitor C as shown in FIG. 2A. "$C_{BL}$" represents the total parasitic capacitance of the bit line.

Figure 2B:
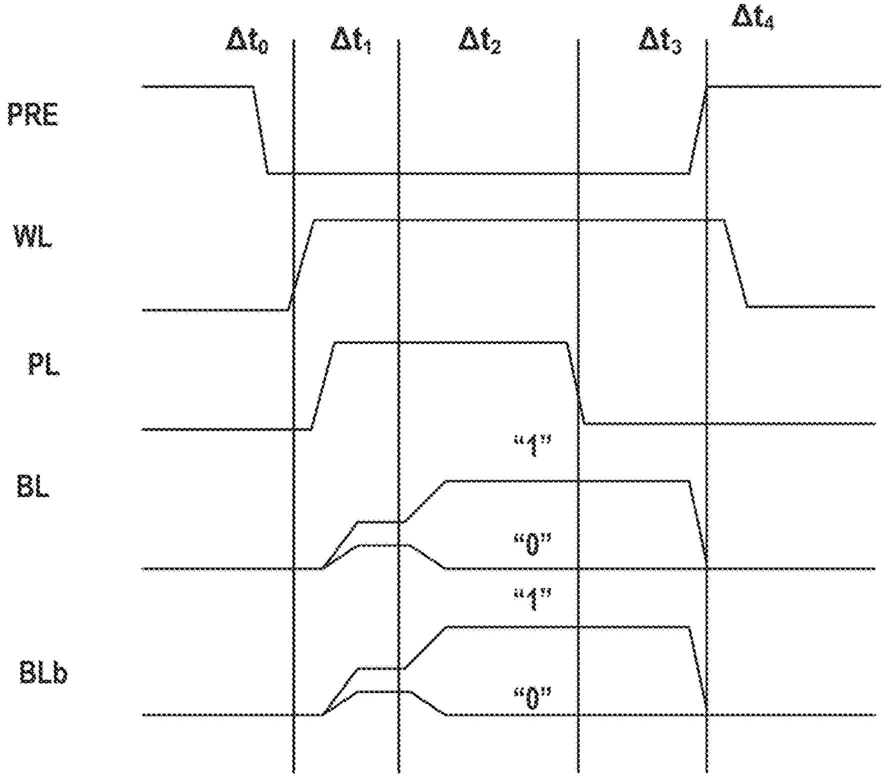
FIG. 2B illustrates a timing diagram of a read operation of the ferroelectric memory cell in FIG. 2A, according to some embodiments of the present disclosure.

FIG. 2B illustrates a timing diagram of an exemplary read operation of the ferroelectric memory cell in FIG. 2A, according to some embodiments of the present disclosure. The read operation of the ferroelectric memory cell, which is selected by the positive WL signal, in FIG. 2A includes two steps. In the first step, the PL signal switches from low voltage to high voltage, and the data in the ferroelectric memory cell (e.g., the charge stored in the capacitor C) is sensed through the BL signal. As the read operation of ferroelectric memory is "destructive read," which alters the contents of the accessed memory location and needs to be immediately followed by a rewriting of the contents in order to preserve them, in the second step, the PL signal is positive for a fixed time duration and then becomes low voltage, and the sensed data is written back to the ferroelectric memory cell.

As to the write operation of the ferroelectric memory cell, in one example, it also includes two steps: multiple pieces of data are simultaneously sensed from multiple ferroelectric memory cells (e.g., on the same page) in the first step; in the second step, the new data is written to the target ferroelectric memory cell, and other pieces of original data are simultaneously written back to other ferroelectric memory cells in the same page. In another example, if a larger input/output bandwidth is given, the new data covered in the entire page can be written to the target ferroelectric memory cell without the prior sensing step.

As described above, normal ferroelectric memory read operations require both sensing and writing-back steps. In terms of performance, the two steps consume a similar amount of time due to signal controls. Thus, ferroelectric memory performance, in theory, should be the same as that of comparable DRAM (e.g., both having 1T-1C configurations).

As described above, normal ferroelectric memory read operations require both sensing and writing-back steps. In terms of performance, each of the two steps consumes a similar amount of time due to similar signal controls. Thus, ferroelectric memory performance, in theory, should be the same as that of comparable DRAM (e.g., both having 1T-1C configurations).

Various implementations of the present disclosure provide an exemplary sign-bit implementation scheme. For instance, the exemplary sign-bit implementation scheme may include writing a set of sign bits (e.g., one or more sign bit(s)) that is/are used to indicate the polarity of the data bit written to a FeRAM cell. For instance, a sign bit of "0" may be written along with each data bit to indicate "true" state, or the cell is stored in the original state. If the sign bit is "1," indicating "false" state, or the cell data is in the inverse state.

When reading data from the FeRAM cell, the controller may determine the polarity of sign bits first. The data bit written to the FeRAM cell is inverted or is not inverted and can then be correctly identified based on the polarity of sign bit. The sign-bit implementation scheme of the present disclosure includes an error-correction operation. The error-correction operation may be used to identify the polarity of the sign bit written to the FeRAM cell. For instance, the error-correction operation may include an ECC operation or a majority-vote operation. When the sign-bit implementation scheme includes the ECC operation, the set of sign bits may include a single sign bit. On the other hand, when the sign-bit implementation scheme includes the majority-vote operation, the set of sign bits may include an odd integer number of sign bits greater than one (e.g., three, five, seven, etc.). Additional details of the exemplary sign-bit implementation scheme are set forth below in connection with FIGS. 3 and 4.

Figure 3:
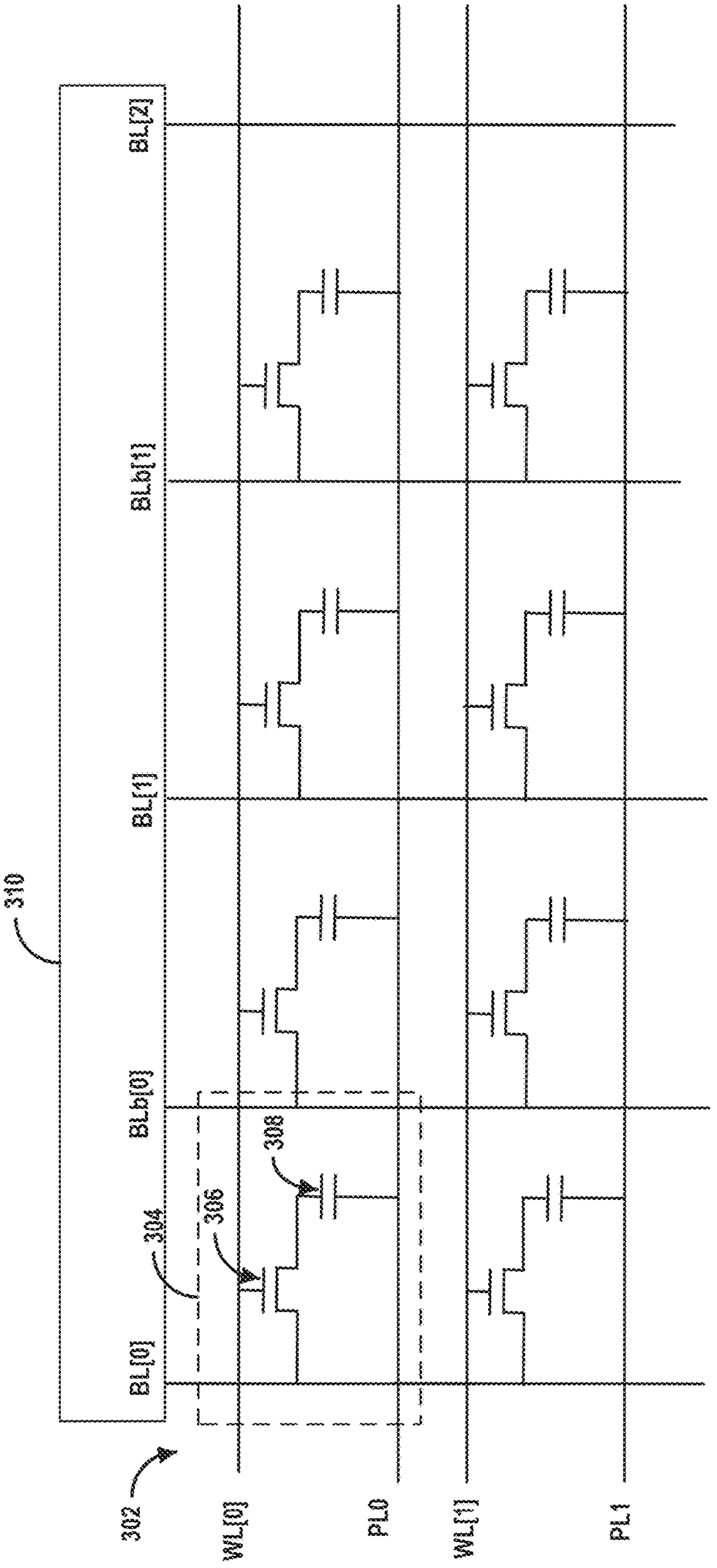
FIG. 3 illustrates a circuit diagram of a ferroelectric memory device configured to implement a sign-bit implementation scheme for a read operation, a write operation, and/or a write-back operation, according to some embodiments of the present disclosure.

FIG. 3 illustrates a circuit diagram of exemplary ferroelectric memory cells including a set of ferroelectric memory cells 302 that maintain a data bit and a sign bit, according to some embodiments of the present disclosure. As shown in FIG. 3, a ferroelectric memory device 300 includes set of ferroelectric memory cells 302.

In some embodiments, set of ferroelectric memory cells 302 can include an array of ferroelectric memory cells 304 arranged in rows and columns. Each ferroelectric memory cell 304 can be a 1T-1C memory cell that includes a transistor 306 and a capacitor 308 as shown in FIG. 3. Each word line WL[0] or WL[1] is electrically connected to the gates of transistors 306 in each ferroelectric memory cell 304 in the same row of the array, and each bit line BL[0] or BL[1] is electrically connected to the sources/drains of transistors 306 in each ferroelectric memory cell 304 in the same column of the array. Each plate line PL0 or PL1 is electrically connected to one electrode of capacitor 308 in each ferroelectric memory cell 304 in the same row of the array. In each ferroelectric memory cell 304, the drain/source of transistors 306 is electrically connected to the other electrode of each capacitor 308.

In some embodiments, in each set of ferroelectric memory cells 302, at least one ferroelectric memory cell 304 may be configured to maintain a sign bit. When the sign-bit implementation scheme includes an ECC, each set of ferroelectric memory cells 302 may include one ferroelectric memory cell 304 that stores a sign bit, two or more other ferroelectric memory cell(s) that store ECC bits, and at least one further ferroelectric memory cell(s) that store data bits (e.g., user data). In some implementations, when the sign-bit implementation scheme includes the majority vote operation, each set of ferroelectric memory cells 302 may include an odd integer number of ferroelectric memory cells 304 greater than one (e.g., three, five, seven, etc.).

In some embodiments, ferroelectric memory device 300 also includes a peripheral circuit 310 electrically connected to set of ferroelectric memory cells 302 through the bit lines, word lines, and plate lines. Peripheral circuit 310 can include any suitable analog, digital, and mixed-signal circuits for facilitating the operations of the ferroelectric memory cells by applying and sensing voltage signals and/or current signals to and from the ferroelectric memory cells through bit lines, word lines, source lines, and plate lines. Peripheral circuit 310 can include various types of peripheral circuits formed using metal-oxide-semiconductor (MOS) technologies, including, for example, page buffer/sense amplifier, column decoder/bit line driver, row decoder/word line driver, voltage generator, control logic, registers, interface, and data bus.

In some embodiments, peripheral circuit 310 may include a word line driving circuit, a plate line driving circuit, and a bit line driving circuit. The word line driving circuit can be configured to generate a plurality of word line signals and apply the plurality of word line signals to each word line, respectively, to select ferroelectric memory cells 304 electrically connected to the same word line (e.g., WL[0] in FIG. 3) on which the word line signal is applied. The plate line driving circuit can be configured to generate plate line signals and apply each plate line signal to a respective one of the plate lines (e.g., PL0 in FIG. 3) according to a plate line time sequence (i.e., a plate line coding). Each plate line signal can be applied across respective capacitor 308 through the respective plate line to polarize respective ferroelectric memory cell 304. The bit line driving circuit can be configured to generate bit line signals and apply a bit line signal to the respective bit line (e.g., BL[0] in FIG. 3) according to a bit line time sequence (i.e., a bit line coding) to write a valid state of data into capacitor 308 in respective ferroelectric memory cell 302 during the write operation. In some embodiments, each bit line signal is a voltage signal pulsed between 0 V and the supply voltage Vdd. The bit line signal is a binary signal of either 0 V or the Vdd, according to some embodiments. During the read operation, the bit line signal can be read through the respective bit line (e.g., BL[0] in FIG. 3) by the bit line driving circuit and compared with one or more reference voltages to determine a valid state of the data stored in capacitor 308. Various operations of the sign-bit implementation scheme will now be described. In some implementations, the sign-bit implementation scheme may be used for a read operation/write-back operation. In some other implementations, the sign-bit implementation scheme may be used for a write operation.

Still referring to FIG. 3 peripheral circuit 310 may write a first data bit having a first value to a ferroelectric memory cell 304 (a first ferroelectric memory cell) of the set of ferroelectric memory cells 302. Peripheral circuit 310 may write a sign bit having the first value to another ferroelectric memory cell 304 (a second ferroelectric memory cell) of the set of ferroelectric memory cells 302. The sign bit may indicate the polarity of the set of ferroelectric memory cells 302 at the time of writing.

The peripheral circuit 310 may receive a read-operation request or a write-operation request for the first ferroelectric memory cell.

A FeRAM read operation is a destructive read. This means that peripheral circuit 310 has to restore read-out data bits by a write-back operation after each read. Read and read cycling are performed at a higher order-of-magnitude than that of a write. During a read, the peripheral circuit 310 reads data bits and corresponding sign bits from the set of ferroelectric memory cells 302 to determine whether the polarity of the set of ferroelectric memory cells 302 has changed since the previous write.

During a FeRAM write, the peripheral circuit 310 pre-reads the sign bits and data bits to determine whether the polarity of the set of ferroelectric memory cells 302 has changed since the previous write operation. This determination is made before peripheral circuit 310 writes new data.

Thus, in response to the read-operation request or the write-operation request, peripheral circuit 310 may read the sign bit from another ferroelectric memory cell 304. Based on the value of the sign bit, peripheral circuit 310 may determine whether the polarity of the set of ferroelectric memory cells 302 has changed since the previous write.

As an example, assuming the value of the sign bit stored at the previous write is 0 (a first value), if a sign bit value of 0 is read out in a subsequent read or write operation, the peripheral circuit 310 may determine the set of ferroelectric memory cells 302 stores data bits with the correct polarity. Thus, in response to the sign bit having the first value, the peripheral circuit 310 may read the data bit with the first value from the ferroelectric memory cell 304.

Conversely, still assuming the value of the sign bit stored at the previous write is 0, if a sign bit value of 1 (a second value) is read out in the subsequent read or write, the peripheral circuit 310 may determine the set of ferroelectric memory cells 302 stores data bits with an incorrect polarity. Thus, in response to the sign bit having a second value (any value different than the first value), the peripheral circuit 310 may invert the data bit from the second value to the first value, and read the first data bit with the first value (inverted from the second value) from the ferroelectric memory cell 304. This read may be performed in response to a read-operation request or a write-operation request.

In response to the write-operation request, the peripheral circuit 310 may invert the sign bit from the first value to the second value, and write a second data bit (a new data bit) having a second value to the ferroelectric memory cell 304 and the sign bit having the second value to the another ferroelectric memory cell 304. This inversion may be performed based on the implementation of the pre-defined design algorithm.

I response to the read-operation request, the peripheral circuit 310 may invert each of the data bit and the sign bit from the first value to the second value, and write the data bit having a second value to the ferroelectric memory cell 304 and the sign bit having the second value to the another ferroelectric memory cell 304. Here, the peripheral circuit 310 may write the data bit having the second value to the ferroelectric memory cell 304 and the sign bit having the second value to the another ferroelectric memory cell 304 as part of a write-back operation. In some implementations, the first data bit having the second value may be written to the ferroelectric memory cell 304 concurrent with the sign bit having the second value being written to the another ferroelectric memory cell 304. This inversion may be performed based upon the implementation of the pre-defined design algorithm.

Figure 4A:
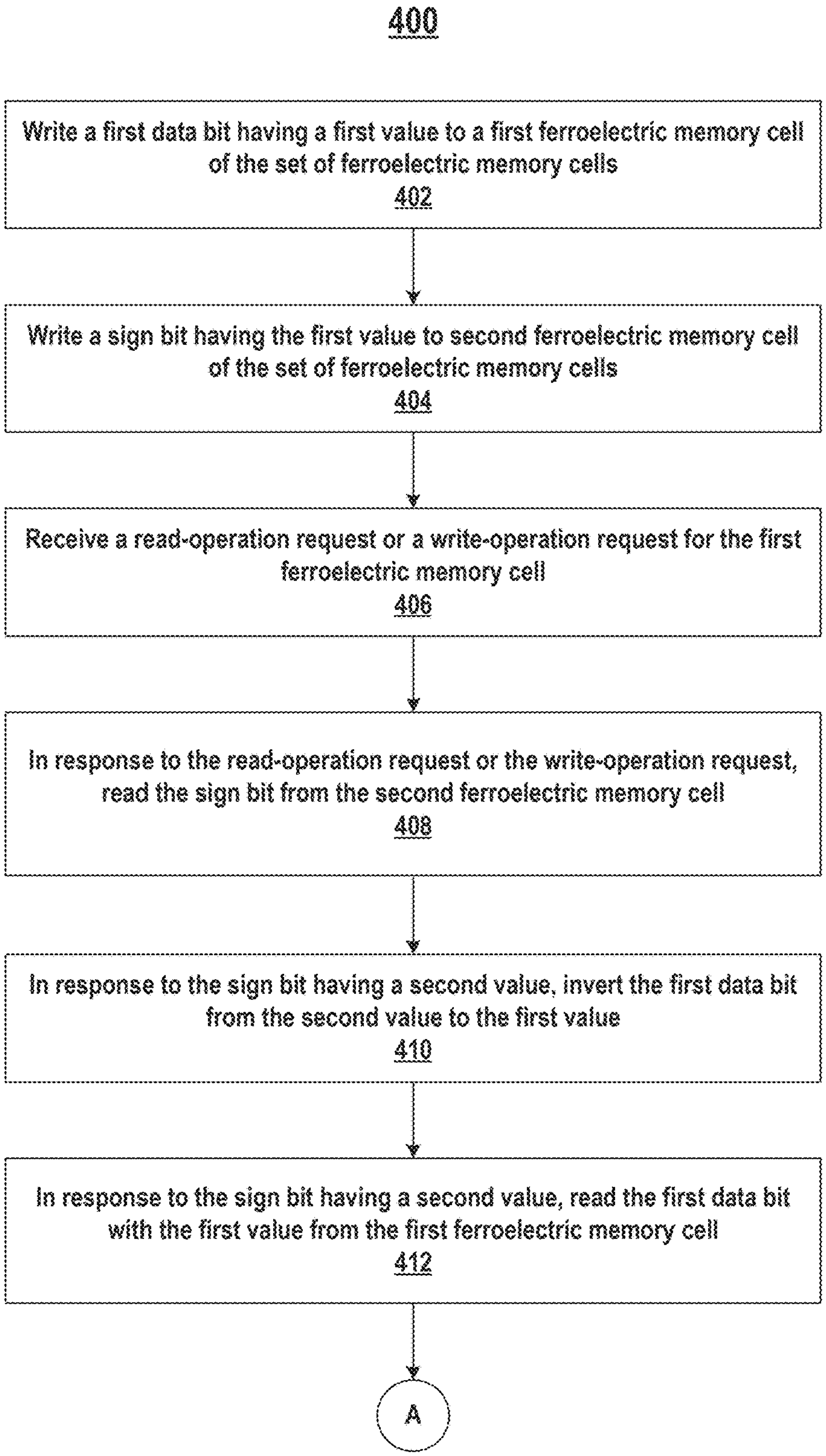
FIGS. 4A and 4B are a flowchart of a method for operating ferroelectric memory cells, according to some embodiments of the present disclosure.
Figure 4B:
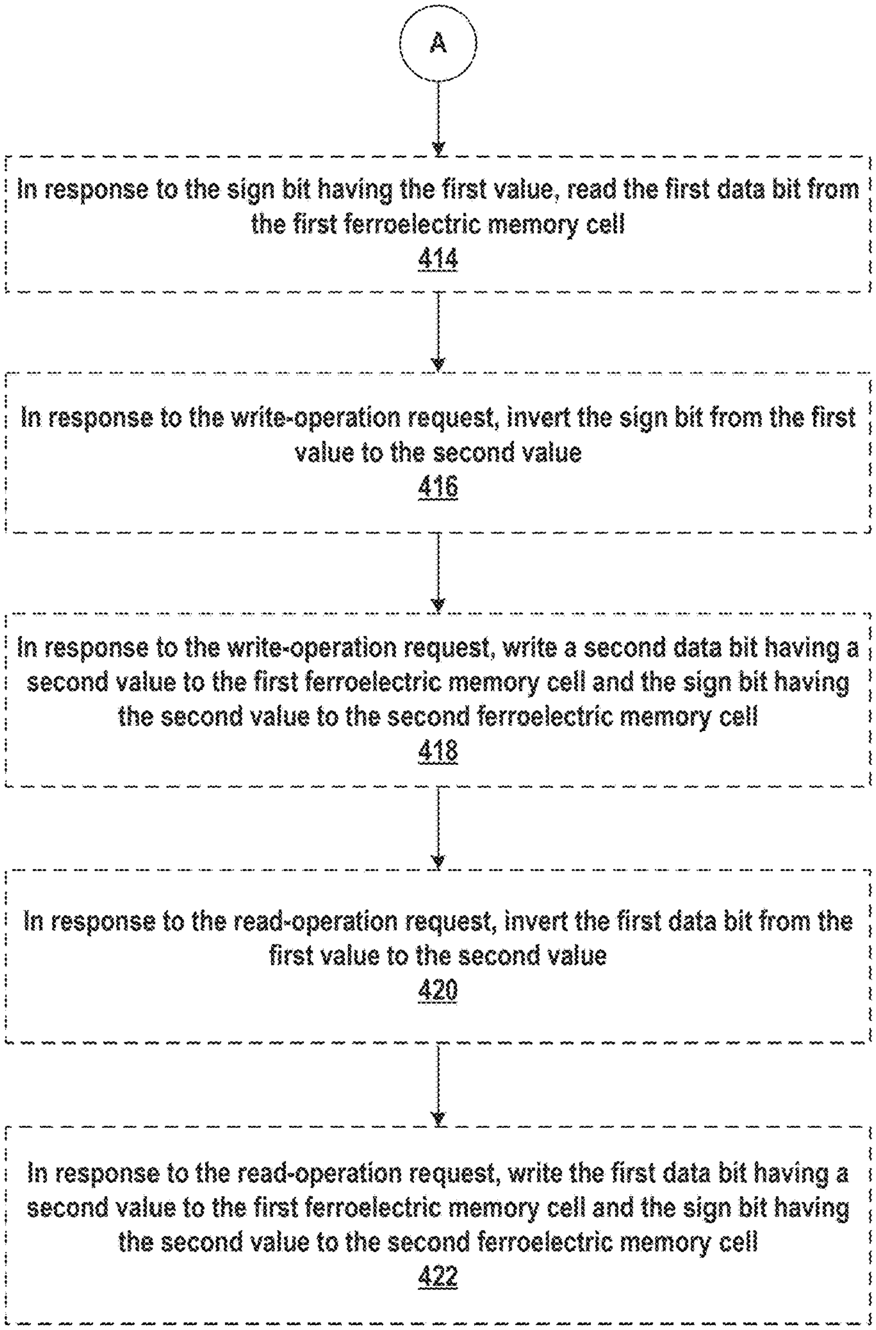

FIGS. 4A and 4B illustrate a flow chart of an exemplary method of operating ferroelectric memory cells, according to some embodiments of the present disclosure. Method 400 may be performed by an apparatus, e.g., such as ferroelectric memory device 300 or peripheral circuit 310 or any other suitable apparatus. Method 400 may include operations 402-422 as described below. It is understood that some of the operations may be optional, and some of the operations may be performed simultaneously, or in a different order other than shown in FIGS. 4A and 4B.

Referring to FIG. 4A, at 402, the apparatus may write a first data bit having a first value to a first ferroelectric memory cell of the set of ferroelectric memory cells. For example, referring to FIG. 3 peripheral circuit 310 may write a first data bit having a first value to a ferroelectric memory cell 304 (a first ferroelectric memory cell) of the set of ferroelectric memory cells 302.

At 404, the apparatus may write a sign bit having the first value to second ferroelectric memory cell of the set of ferroelectric memory cells. In some implementations, the sign bit may indicate a polarity of the first ferroelectric memory cell and the second ferroelectric memory cell. For example, referring to FIG. 3, peripheral circuit 310 may write a sign bit having the first value to another ferroelectric memory cell 304 (a second ferroelectric memory cell) of the set of ferroelectric memory cells 302. The sign bit may indicate the polarity of the set of ferroelectric memory cells 302 and the another ferroelectric memory cell 304 at the time of writing.

At 406, the apparatus may receive a read-operation request or a write-operation request for the first ferroelectric memory cell. For example, referring to FIG. 3 the peripheral circuit 310 may receive a read-operation request or a write-operation request for the first ferroelectric memory cell.

At 408, the apparatus may, in response to the read-operation request or the write-operation request, read the sign bit from the second ferroelectric memory cell. In some implementations, when the sign bit has the first value, the first data bit may have a correct polarity. In some implementations, when the sign bit has the second value, the first data bit may have an inverted polarity from actual data. For example, referring to FIG. 3 in response to the read-operation request or the write-operation request, the peripheral circuit 301 may read the sign bit from the another ferroelectric memory cell 304. Based on the value of the sign bit, the peripheral circuit 310 may determine whether the polarity of the set of ferroelectric memory cells 302 has changed since the previous write.

At 410, the apparatus may, in response to the sign bit having a second value, invert the first data bit from the second value to the first value. For example, referring to FIG. 3, assuming the value of the sign bit stored at the previous write is 0, if a sign bit value of 1 (a second value) is read out in the subsequent read or write, the peripheral circuit 310 may determine the set of ferroelectric memory cells 302 stores data bits with an incorrect polarity. Thus, in response to the sign bit having a second value (any value different than the first value), the peripheral circuit 310 may invert the data bit from the second value to the first value.

At 412, the apparatus may, in response to the sign bit having a second value, read the first data bit with the first value from the first ferroelectric memory cell after the inverting. For example, referring to FIG. 3 in response to the sign bit having a second value (any value different than the first value), the peripheral circuit 310 may invert the data bit from the second value to the first value, and read the first data bit with the first value (inverted from the second value) from the ferroelectric memory cell 304. This read may be performed in response to a read-operation request or a write-operation request.

Referring to FIG. 4B, at 414, the apparatus may, in response to the sign bit having the first value, read the first data bit from the first ferroelectric memory cell. For example, referring to FIG. 3, assuming the value of the sign bit stored at the previous write is 0 (a first value), if a sign bit value of 0 is read out in a subsequent read or write operation, the peripheral circuit 310 may determine the set of ferroelectric memory cells 302 stores data bits with the correct polarity. Thus, in response to the sign bit having the first value, the peripheral circuit 310 may read the data bit with the first value from the ferroelectric memory cell 304.

At 416, the apparatus may, in response to the write-operation request, invert the sign bit from the first value to the second value. For example, referring to FIG. 3, in response to the write-operation request, the peripheral circuit 310 may invert the sign bit from the first value to the second value.

At 418, the apparatus may, in response to the write-operation request, write a second data bit having a second value to the first ferroelectric memory cell and the sign bit having the second value to the second ferroelectric memory cell. In some implementations, the second data bit may have the second value, which is new data. For example, referring to FIG. 3, in response to the write-operation request, the peripheral circuit 310 may write a second data bit (a new data bit) having a second value to the ferroelectric memory cell 304 and the sign bit having the second value to the another ferroelectric memory cell 304.

At 420, the apparatus may, in response to the read-operation request, invert the first data bit from the first value to the second value. For example, referring to FIG. 3 in response to the read-operation request, the peripheral circuit 310 may invert the first data bit from the first value to the second value.

At 422, the apparatus may, in response to the read-operation request, write the first data bit having a second value to the first ferroelectric memory cell and the sign bit having the second value to the second ferroelectric memory cell. In some implementations the first data bit having the second value and the sign bit having the second value may be written to the first ferroelectric memory cell and the second ferroelectric memory cell, respectively, as part of a write-back operation. In some implementations, the first data bit having the second value may be written to the first ferroelectric memory cell concurrent with the sign bit having the second value being written to the second ferroelectric memory cell. For example, referring to FIG. 3 in response to the read-operation request, the peripheral circuit 310 may write the data bit having a second value to the ferroelectric memory cell 304 and the sign bit having the second value to the another ferroelectric memory cell 304.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method of operating a set of ferroelectric memory cells, comprising:
- writing a first data bit having a first value to a first ferroelectric memory cell of the set of ferroelectric memory cells at a first time;
- writing a sign bit having the first value to second ferroelectric memory cell of the set of ferroelectric memory cells at the first time, the sign bit indicating a polarity of the first ferroelectric memory cell and the second ferroelectric memory cell;
- receiving a read-operation request or a write-operation request for the first ferroelectric memory cell at a second time following the first time;
- in response to the read-operation request or the write-operation request, reading the sign bit from the second ferroelectric memory cell at the second time; and
- in response to the sign bit having a second value at the second time,
  - inverting the first data bit from the second value to the first value; and
  - reading the first data bit with the first value from the first ferroelectric memory cell after the inverting.

2. The method of claim 1, further comprising:
- in response to the sign bit having the first value at the second time, reading the first data bit with the first value from the first ferroelectric memory cell.

3. The method of claim 1, further comprising:
- in response to the write-operation request, inverting the sign bit from the first value to the second value.

4. The method of claim 3, further comprising:
- in response to the write-operation request, writing a second data bit having a second value to the first ferroelectric memory cell and the sign bit having the second value to the second ferroelectric memory cell.

5. The method of claim 4, wherein the second data bit having the second value is new data.

6. The method of claim 1, further comprising:
- in response to the read-operation request, inverting the first data bit from the first value to the second value.

7. The method of claim 1, further comprising:
- in response to the read-operation request, writing the first data bit having a second value to the first ferroelectric memory cell and the sign bit having the second value to the second ferroelectric memory cell.

8. The method of claim 7, wherein the first data bit having the second value and the sign bit having the second value are written to the first ferroelectric memory cell and the second ferroelectric memory cell, respectively, as part of a write-back operation.

9. The method of claim 7, wherein the first data bit having the second value is written to the first ferroelectric memory cell concurrent with the sign bit having the second value being written to the second ferroelectric memory cell.

10. The method of claim 1, wherein:
- when the sign bit has the first value at the second time, the first data bit has a correct polarity, and
- when the sign bit has the second value at the second time, the first data bit has an inverted polarity from actual data.

11. A memory device, comprising:
- a set of ferroelectric memory cells; and
- a peripheral circuit coupled to the set of ferroelectric memory cells and configured to:
  - write a first data bit having a first value to a first ferroelectric memory cell of the set of ferroelectric memory cells at a first time;
  - write a sign bit having the first value to second ferroelectric memory cell of the set of ferroelectric memory cells at the first time, the sign bit indicating a polarity of the first ferroelectric memory cell and the second ferroelectric memory cell;
  - receive a read-operation request or a write-operation request for the first ferroelectric memory cell at a second time following the first time;
  - in response to the read-operation request or the write-operation request, read the sign bit from the second ferroelectric memory cell at the second time; and
  - in response to the sign bit having a second value at the second time,
    - invert the first data bit from the second value to the first value; and
    - read the first data bit with the first value from the first ferroelectric memory cell after the inverting.

12. The memory device of claim 11, wherein the peripheral circuit is further configured to:
- in response to the sign bit having the first value at the second time, read the first data bit with the first value from the first ferroelectric memory cell.

13. The memory device of claim 11, wherein the peripheral circuit is further configured to:
- in response to the write-operation request, invert the sign bit from the first value to the second value.

14. The memory device of claim 13, wherein the peripheral circuit is further configured to:
- in response to the write-operation request, write a second data bit having a second value to the first ferroelectric memory cell and the sign bit having the second value to the second ferroelectric memory cell.

15. The memory device of claim 14, wherein the second data bit having the second value is new data.

16. The memory device of claim 11, wherein the peripheral circuit is further configured to:

in response to the read-operation request, invert the first data bit from the first value to the second value.

17. The memory device of claim 11, wherein the peripheral circuit is further configured to:

in response to the read-operation request, write the first data bit having a second value to the first ferroelectric memory cell and the sign bit having the second value to the second ferroelectric memory cell.

18. The memory device of claim 17, wherein the first data bit having the second value and the sign bit having the second value are written to the first ferroelectric memory cell and the second ferroelectric memory cell, respectively, as part of a write-back operation.

19. The memory device of claim 17, wherein the first data bit having the second value is written to the first ferroelectric memory cell concurrent with the sign bit having the second value being written to the second ferroelectric memory cell.

20. The memory device of claim 11, wherein:

when the sign bit has the first value at the second time, the first data bit has a correct polarity, and when the sign bit has the second value at the second time, the first data bit has an inverted polarity from actual data.

* * * * *